United States Patent [19]
Scholten et al.

[11] Patent Number: 5,366,588
[45] Date of Patent: Nov. 22, 1994

[54] METHOD OF MANUFACTURING AN ELECTRICALLY CONDUCTIVE PATTERN OF TIN-DOPED INDIUM OXIDE (ITO) ON A SUBSTRATE

[75] Inventors: Monica Scholten; Johannes E. A. M. Van Den Meerakker; Johannes W. M. Jacobs, all of Eindhoven, Netherlands

[73] Assignee: U.S. Philips Corporation, New York, N.Y.

[21] Appl. No.: 25,683

[22] Filed: Mar. 3, 1993

[30] Foreign Application Priority Data

Mar. 13, 1992 [EP] European Pat. Off. ........... 92200732

[51] Int. Cl.⁵ .............. H01L 21/00; H01L 21/02; H01L 21/312
[52] U.S. Cl. .................. 156/656; 156/654; 156/655
[58] Field of Search ............... 156/654, 655, 656

[56] References Cited

U.S. PATENT DOCUMENTS 4,093,504  6/1978  Ponjee et al. ............. 156/656
4,448,637  5/1984  Hiraishi et al. ............ 156/656

FOREIGN PATENT DOCUMENTS 0299035  12/1987  Japan.
0051622  2/1989  Japan.

*Primary Examiner*—R. Bruce Breneman
*Assistant Examiner*—B. Everhart
*Attorney, Agent, or Firm*—John C. Fox

[57] ABSTRACT

Method of manufacturing an electrically conductive pattern of tin-doped indium oxide (ITO) on a substrate.

Tin-doped indium oxide (ITO) can be selectively etched relative to the metals Mo, W and TiW in an etching bath which is obtained by diluting concentrated halogen acid, for example hydrochloric acid, with a liquid having a lower dielectric constant than water, such as acetic acid or methanol. This is particularly advantageous in the manufacture of the MIM switching elements which are present on the active plate of LCDs.

16 Claims, 2 Drawing Sheets

METHOD OF MANUFACTURING AN ELECTRICALLY CONDUCTIVE PATTERN OF TIN-DOPED INDIUM OXIDE (ITO) ON A SUBSTRATE

BACKGROUND OF THE INVENTION

The invention relates to a method of manufacturing an electrically conductive pattern of tin-doped indium oxide (ITO) on a substrate, in which method a layer of tin-doped indium oxide is provided on the substrate after which the layer is structured lithographically using an aqueous etching bath which contains halogen acid.

The invention also relates to a method of manufacturing a supporting plate for a liquid crystal display device, which supporting plate has patterns of tin-doped indium oxide as well as conductors of a metal which dissolve in an oxidizing etching bath, in particular a metal selected from the group consisting of Mo, W and TiW.

The invention further relates to the use of an etching bath consisting of an aqueous solution of halogen acid and a liquid selected from the group consisting of acetic acid and methanol for selectively etching ITO relative to metals which dissolve in an oxidizing etching bath, in particular a metal selected from the group consisting of Mo, W and TiW, Such a method is used, for example, in the manufacture of electrooptical display devices such as liquid crystal display devices (LCDs), electroluminescent display devices, photocells and solid-state image sensors, In an LCD, a liquid crystalline medium is sandwiched between two parallel glass supporting plates. Transparent electrodes which generally consist of semiconductive metal oxide such as tin-doped indium oxide, are provided on the sides of the supporting plates facing the medium. The latter material is commonly referred to as ITO and can be provided on the supporting plates in the form of a layer by sputtering, vacuum deposition, Chemical Vapour Deposition (CVD) or by hydrolysis and pyrolysis of a corresponding metal compound, The ITO layer generally has a thickness in the range between 20 and 400 nm and comprises, for example, 2-10 atom % of tin, The desired electrode pattern is obtained by etching the ITO layer, in accordance with a pattern, using a suitable chemical etchant, U.S. Pat. No. 4,093,504 discloses a method of manufacturing patterns of ITO, in which method a photoresist layer is provided on an ITO layer, after which the photoresist layer is exposed to patterned radiation and then developed. ITO is subsequently etched using an etching bath consisting of a mixture of hydrochloric acid and $FeCl_3$, thereby forming the ITO pattern. The presence of $FeCl_3$ increases the etching rate of the ITO.

A disadvantage of the known method is that $FeCl_3$ is harmful to the environment. Another disadvantage is the oxidizing property of $FeCl_3$, which causes not only ITO but also some other metals present on certain types of LCD panels, for example Mo, to be attacked. Thus, the known etching bath is not a selective ITO etchant.

OBJECT AND SUMMARY OF THE INVENTION

It is an object of the invention to provide, inter alia, a method which does not have the above drawbacks and which has advantages which will be described in more detail hereinbelow.

According to the invention, this object is achieved by a method as described in the opening paragraph, which is characterized in that the etching bath is prepared by diluting concentrated halogen acid with a liquid having a lower dielectric constant ($\epsilon$) than water. A suitable halogen acid is hydrochloric acid, but other halogen acids, namely HBr and HI, can also suitably be used. HF is also suited for etching ITO, but this acid has the disadvantage that it also attacks the glass of the supporting plate on which the ITO layer is provided. Concentrated hydrogen bromide contains 9 mol of HBr per liter of water; concentrated HI contains 6 mol of HI per liter of water and concentrated hydrochloric acid contains 12 mol of HCl per liter of water (37 % by weight of HCl). Concentrated halogen acid can be used for etching ITO. However, an etching bath having such a high concentration of halogen acid also attacks the photoresist layer used in the lithography process. The attack on the photoresist layer can be reduced by diluting the halogen acid with water, but this causes a substantial reduction of the etching rate of the ITO layer. This leads to undesirably long processing times or, at a given processing time, to undesirably high processing temperatures.

If the concentrated halogen acid is not diluted with water but with a liquid having a lower dielectric constant than water ($\epsilon=78.5$) an etching rate of ITO is obtained which is higher than that of water-diluted halogen acid baths. A possible explanation could be that the undissociated halogen acid molecule in halogen acid solutions is responsible for the etching of ITO. Dissociation of the halogen acid molecule is abated by diluting the halogen acid solution with a liquid having a lower dielectric constant than water. Suitable liquids are, for example, acetic acid ($\epsilon=6.15$) and methanol ($\epsilon=32.6$). Other suitable liquids are, for example, ethanol ($\epsilon=24.3$), propanol-1 ($\epsilon=20.1$) and isopropanol ($\epsilon=18.3$). Said liquids can be mixed with concentrated halogen acid in any ratio. By virtue of the lower dielectric constant, an etching bath diluted with acetic acid has a higher ITO-etching rate than an etching bath diluted with an equal percentage by volume of methanol. A practical concentration of diluting liquid ranges from 25% to 75% by volume. At a lower concentration of diluting liquid the photoresist layer is noticeably attacked, resulting in a deterioration of the pattern definition. At a higher concentration of diluting liquid the ITO etching rate is reduced so that the processing times become undesirably long. A practical concentration of diluting liquid is, for example, 50% by volume, i.e. starting from concentrated hydrochloric acid the concentration of hydrocloric acid in such an etching bath is 6 mol/l. At such a degree of dilution, the hydrochloric acid does not noticeably attack the photoresist layer and a favourable etching rate of the ITO is obtained. Furthermore alkanols and acetic acid are considerably less harmful to the environment than the conventionally used $FeCl_3$.

The invention also relates to a method of manufacturing a supporting plate for a liquid crystal display device, which supporting plate comprises patterns of tin-doped indium oxide (ITO) as well as metal conductors which dissolve in an oxidizing etching bath, which method is characterized in that the patterns of tin-doped indium oxide are obtained by treating them in an etching bath which is prepared by diluting concentrated halogen acid with a liquid having a lower dielectric constant than water. Such supporting plates are used in a liquid crystal television screen (LC-TV), in the form of both an active and a passive plate. An active plate comprises a transparent glass plate as the substrate on which, in addition to pixels, patterned switching elements are present. By virtue thereof, a better picture quality and contrast are obtained. The switching elements may be diode switches, TFTs (Thin Film Transistors) and MIM switches (Metal Insulator Metal). Such switching elements often comprise a metal such as Mo, W or TiW. An MIM switching element may be constructed from, for example, in succession a first Mo layer, an insulator layer of silicon nitride $SiN_x$ and a second Mo layer. The switching elements can be obtained (photo)lithographically, the various layers being etched with suitable etching baths. In the manufacture of an active plate comprising said metals the problem arises that the use of the known ITO-etching baths causes said metals to be attacked too, since the known ITO-etching baths are oxidizing etching baths. The expression "oxidizing etching bath" is to be understood to mean in this connection an etching bath which in addition to an active substance, for example hydrochloric acid, also contains an oxidation agent such as $FeCl_3$, $H_2O_2$, Ce(IV) salts, nitric acid, permanganate or bichromate, which causes both ITO and said metals to be etched. The known etching baths do not enable the ITO layer to be selectively etched with respect to metals which dissolve in an oxidizing etching bath such as Cr, Cu, Ni and, in particular, Mo, W and TiW. It is true that water-diluted halogen acid does not attack Mo, but it leads to undesirably long etching times of the ITO layer. The method in accordance with the invention enables ITO layers to be etched selectively without metals such as Mo, W and TiW being attacked.

The method in accordance with the invention is advantageous in the manufacture of the active plate, but also in the manufacture of a passive plate of an LCD, in which process ITO has to be selectively etched relative to, for example, Mo in the so-called IC-area.

Suitable diluting liquids are, for example, the above-described acetic acid and methanol. Said liquids are added to the concentrated halogen acid in a concentration in the range from 25% to 75% by volume, for example 50% by volume. Outside this concentration range the above-mentioned disadvantages occur.

The use of an etching bath consisting of an aqueous solution of halogen acid and a liquid having a lower dielectric constant than water, in particular acetic acid or methanol, combines the advantage of a favourable etching rate of ITO with the possibility of selectively etching ITO relative to metals such as Mo, W and TiW.

BRIEF DESCRIPTION OF THE DRAWINGS

The invention will be explained in greater detail by means of exemplary, embodiments with reference to the drawings, in which.

DESCRIPTIONS OF THE PREFERRED EMBODIMENTS

Exemplary Embodiment 1.

An ITO layer having a thickness of 120 nm is sputtered onto a glass plate. During sputtering the temperature of the glass plate is 350° C. In addition to indium oxide, the ITO layer comprises 4 at % of tin. The ITO layer is partly covered with a protective lacquer, for example a photoresist layer (novolak PFR 3700 available from UCB). Said ITO layer is subsequently etched in an etching bath having a temperature of 30° C. To etch the ITO layer, three types of etching baths, namely:

type A: concentrated hydrochloric acid diluted with water ($\epsilon = 78.5$), type B: concentrated hydrochloric acid diluted with methanol ($\epsilon = 32.6$), and type C: concentrated hydrochloric acid diluted with acetic acid ($\epsilon = 6.15$).

The dilutions of each type of etching bath were varied between 0 and 100% by volume and the associated etching rates of the ITO layer were measured. The etch depth of the ITO layer was measured by means of a Tencor Alpha-step 200 after etching, rinsing, stripping and drying of the photoresist layer.

Figure 1:
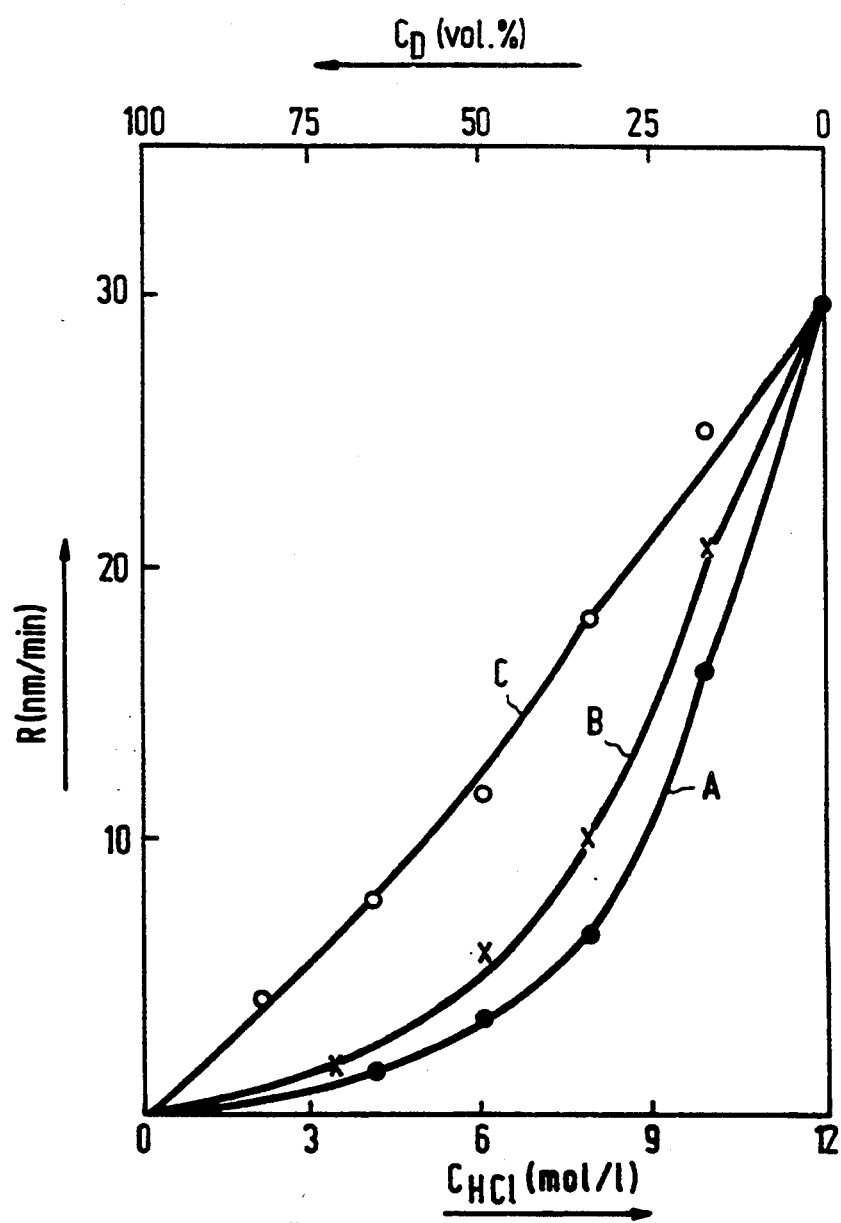
FIG. 1 represents the etching rate R of an ITO layer as a function of the concentration of hydrochloric acid $C_{HCl}$ in the etching bath and the concentration of diluting liquid $C_D$, respectively.

In FIG. 1, the etching rate R (in nm/minute) of the ITO layer is plotted as a function of the concentration of hydrochloric acid $C_{HCl}$ in the etching bath and as a function of the concentration of liquid $C_D$ (water, methanol or acetic acid) with which the concentrated hydrochloric acid is diluted. Curve A having measuring values (●) shows the etching rate of the ITO layer when etching baths are used in which the concentrated hydrochloric acid is diluted with water. Curve B having measuring values (X) shows the etching rate of the ITO layer when etching baths are used in which the concentrated hydrochloric acid is diluted with methanol. Curve C having measuring values (○) shows the etching rate of the ITO layer when etching baths are used in which the concentrated hydrochloric acid is diluted with acetic acid.

FIG. 1 shows that, at an equal HCl concentration in the etching bath, a reduction of the dielectric constant of the diluting liquid in the series $\epsilon_{water} > \epsilon_{methanol} > \epsilon_{acetic\ acid}$ leads to higher etching rates of the ITO layer. Diluting concentrated hydrochloric acid with 50% by volume of water yields an etching rate of the ITO layer of 3 nm/min. Diluting concentrated hydrochloric acid with 50% by volume of acetic acid yields an etching rate of the ITO layer which is four times as high, i.e. 12 nm/min.

Exemplary Embodiment 2.

FIG. 2 is a diagrammatic sectional view of a few stages in the manufacture of an MIM switching element on an active plate for an LCD. A 40 nm thick ITO layer 2 which consists of indium oxide and 4 at. % of tin is sputtered onto a glass substrate 1. A first molybdenum layer 3 having a thickness of 30 nm is sputtered onto said ITO layer. Subsequently, a positive photoresist layer 4 (novolak PFR 3700 available from UCB) is provided on said Mo layer 3 by means of spin coating. In a customary photolithographic process, a window 5 of dimensions 10 μm × 10 μm is formed in the photoresist layer. The multilayer structure obtained is shown in FIG. 2A. In this window 5, a window is subsequently etched in the Mo layer 3 by using an Mo etching bath of the following composition:

40% by volume of phosphoric acid
2% by volume of nitric acid
33% by volume of acetic acid
25% by volume of water In some cases a layer of TiW is used instead of the Mo layer 3. This material can be etched with 30% by volume of $H_2O_2$ in water.

ITO layer 2 in window 5 is subsequently etched using an etching bath which is prepared by diluting concentrated hydrochloric acid (37% by weight, 12 mol/l) with acetic acid to a concentration of 50% by volume. As a result, the ITO etching bath has the following composition:

6 mol/l of HCl
50% by volume of acetic acid.

Figure 2A:
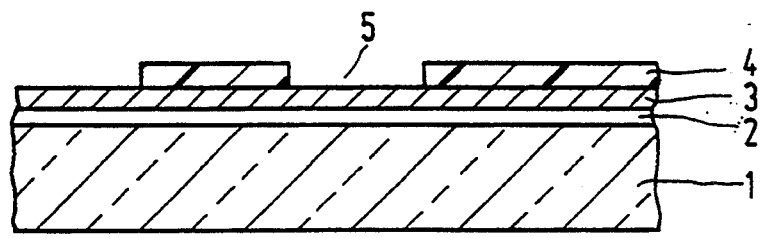
FIG. 2A–E are a diagrammatic sectional views of a few stages in the manufacture of an MIM structure on an active plate for an LCD.
Figure 2B:
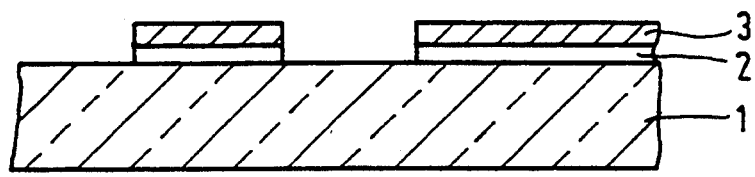
Figure 2C:
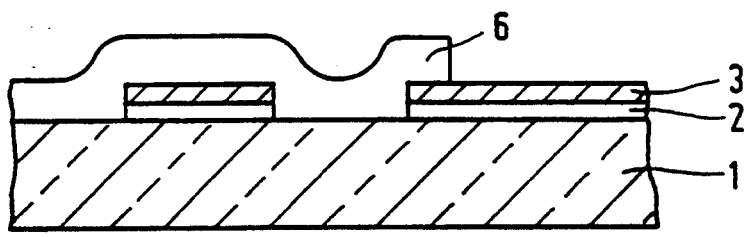

At a temperature of 30° C. the etching rate of the ITO layer is 12 nm/minute. The photoresist layer 4 is still present on the Mo layer 3. The etching bath in accordance with the invention has the advantage that the Mo layer 3 is not attacked, i.e. underetching of the photoresist layer does not occur, so that the dimensions of the window in the Mo layer and in the ITO layer are also 10 $\mu m \times 10$ $\mu m$. In an alternative embodiment, a window is etched in the Mo layer 3 after which the photoresist layer is removed by treating it with a stripping bath. Subsequently, ITO layer 2 is etched, in which process the etched Mo layer serves, in fact, as the etching mask for the underlying ITO layer. After said etching treatment, the structure diagrammatically shown in FIG. 2B is obtained.

Figure 2D:
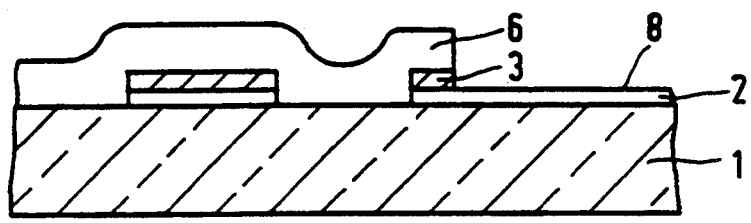

A 70 nm thick insulator layer 6 of silicon nitride is then sputtered onto the Mo layer 3. Said silicon nitride is photolithographically removed above the area of the future pixels by means of reactive ion etching (PIE) in a plasma of a mixture of $SF_6$ and $CCl_4$. This results in the structure shown in FIG. 2C. Mo layer 3 is etched in the area of the pixels 8, using the above-mentioned Mo etching bath. The structure formed in this process is shown in FIG. 2D. Subsequently, a second Mo layer 7 having a thickness of 240 nm is sputtered and then structured in a customary photolithographic process, resulting in the structure shown in FIG. 2E.

Figure 3:
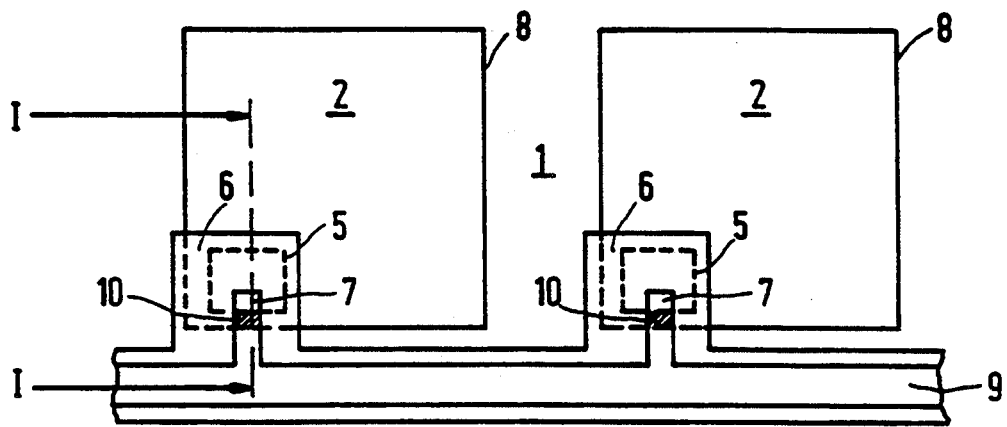
FIG. 3 is a diagrammatic top view of a part of an active plate for an LCD.
Figure 2E:
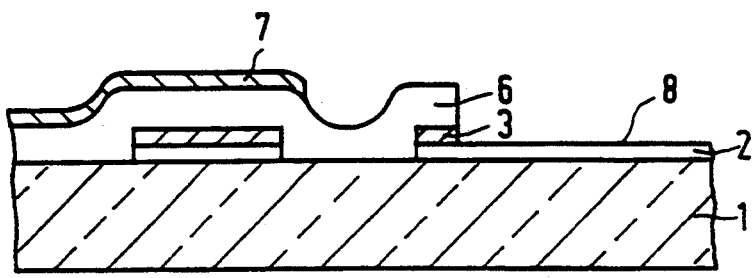

FIG. 3 is a diagrammatic top view of a part of an active plate of an LC-TV having two pixels and two MIM structures. Said Figure shows two pixels 8 having ITO layers 2 on a glass substrate 1. The pixels have windows 5. Said windows are covered with a silicon nitride layer 6 which also extends underneath a row electrode 9 of Mo. Said row electrode is connected to and integral with the Mo layer 7 of the MIM structure. Said MIM structure is situated in the hatched area 10 and consists of a silicon nitride layer sandwiched between two Mo layers. Said MIM structure has the dimensions 4 $\mu m \times 5$ $\mu m$. FIG. 2E is a diagrammatic cross-sectional view taken on the line I—I in FIG. 3.

The method and the etching bath in accordance with the invention enable ITO to be etched selectively with respect to Mo, without using $FeCl_3$ which is harmful to the environment, while maintaining a high etching rate and using an etching bath having a relatively low temperature.

We claim:

1. A method of manufacturing an electrically conductive pattern of tin-doped indium oxide (ITO) on a substrate, in which method a layer of tin-doped indium oxide is provided on the substrate after which the layer is etched in accordance with a pattern using an aqueous etching bath which contains halogen acid and a liquid having a lower dielectric constant than water.

2. A method as claimed in claim 1, in which the etching bath is prepared by diluting concentrated halogen acid with the liquid having a lower electric constant than water.

3. A method as claimed in claim 1 in which prior to etching:
   (a) a photoresist layer is provided on the ITO layer;
   (b) the photoresist layer is exposed to patterned radiation; and
   (c) the photoresist layer is developed.

4. A method as claimed in claim 2, characterized in that acetic acid is used as the diluting agent.

5. A method as claimed in claim 2, characterized in that methanol is used as the diluting agent.

6. A method as claimed in claim 1, characterized in that the halogen acid is concentrated hydrochloric acid.

7. A method as claimed in claim 2, characterized in that an etching bath is used having a concentration of diluting liquid of 25%–75% by volume.

8. A method of selectively etching tin-doped indium oxide (ITO) relative to a metal which dissolves in an oxidizing etching bath, in which the ITO is etched using an etching bath comprising an aqueous solution of halogen acid and a liquid selected from the group consisting of acetic acid and methanol.

9. The method as claimed in claim 8, characterized in that the etching bath is prepared by diluting concentrated hydrochloric acid with 25–75% by volume of acetic acid or methanol.

10. A method of manufacturing a supporting plate for a liquid crystal display device, said supporting plate comprising patterns of tin-doped indium oxide (ITO) as well as metal conductors which dissolve in an oxidizing etching bath, characterized in that the patterns of tin-doped indium oxide are obtained by treating them in an etching bath which contains halogen acid and a liquid having a lower dielectric constant than water.

11. A method as claimed in claim 8, in which the supporting plate is the active plate of a liquid crystal display device, said plate comprising a substrate carrying the patterns of tin-doped indium oxide (ITO) and switching elements composed of a first conductor of a metal selected from the group consisting of Mo, W and TiW, as well as an insulator on the first conductor and a second conductor of a metal selected from the group consisting of Mo, W and TiW on said insulator.

12. A method as claimed in claim 16, characterized in that the halogen acid used in concentrated hydrochloric acid which is diluted with acetic acid or methanol to a concentration of 25%–75% by volume.

13. A method as claimed in claim 4, characterized in that the halogen acid used is hydrochloric acid.

14. A method as claimed in claim 5, characterized in that the halogen acid used is hydrochloric acid.

15. A method of claim 8, in which the metal which dissolves in an oxidizing etching bath is selected from the group consisting of Mo, W and TiW.

16. The method of claim 10, in which the etching bath is prepared by diluting concentrated halogen acid with the liquid having a lower dielectric constant than water.

* * * * *